United States Patent
Levin et al.

(10) Patent No.: US 6,864,726 B2
(45) Date of Patent: Mar. 8, 2005

(54) OUTPUT SIGNAL CONTROL FROM A DAC-DRIVEN AMPLIFIER-BASED DRIVER

(75) Inventors: Alexander Levin, Port Orchard, WA (US); Surya N. Koneru, Penang (MY); John T. Maddux, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/464,232

(22) Filed: Jun. 17, 2003

(65) Prior Publication Data

US 2004/0257127 A1 Dec. 23, 2004

(51) Int. Cl.[7] .................................................. H03B 1/00
(52) U.S. Cl. ...................................... 327/112; 327/104
(58) Field of Search ................................ 327/104, 538, 327/540–546, 560–563, 108, 112, 52, 54, 67, 72–73, 87, 89; 323/313, 315–316; 330/259–260, 262, 265, 255

(56) References Cited

U.S. PATENT DOCUMENTS

| | | | | | |
|---|---|---|---|---|---|
| 4,763,021 A | * | 8/1988 | Stickel | .......................... | 326/71 |
| 4,864,216 A | * | 9/1989 | Kalata et al. | ................ | 323/315 |
| 4,943,784 A | * | 7/1990 | Rybicki | ....................... | 330/264 |
| 5,519,344 A | * | 5/1996 | Proebsting | .................. | 327/108 |
| 5,739,712 A | * | 4/1998 | Fujii | .......................... | 327/323 |
| 5,892,381 A | * | 4/1999 | Koifman et al. | ............. | 327/198 |
| 6,388,477 B1 | * | 5/2002 | Juang | .......................... | 327/112 |
| 6,563,371 B2 | * | 5/2003 | Buckley et al. | ............. | 327/539 |

* cited by examiner

*Primary Examiner*—My-Trang Nu Ton
(74) *Attorney, Agent, or Firm*—Blakely, Sokloff, Taylor & Zafman LLP

(57) ABSTRACT

An apparatus and a method to control an output signal from a DAC-driven amplifier-based driver are disclosed. The apparatus includes an amplifier and a driver. The amplifier has a negative input terminal, a positive input terminal, and a first output terminal. The driver has an input terminal and a second output terminal, the input terminal coupled to the first output terminal of the amplifier and the second output terminal coupled to the positive input terminal of the amplifier to provide a positive feedback to the amplifier. In another embodiment, the apparatus includes a first driver to drive an output signal, the first driver having a first input terminal and a first output terminal, a second driver to generate a feedback, the second driver having a second input terminal and a second output terminal, and an amplifier having a third input terminal to receive an input signal, a fourth input terminal, and a third output terminal, the third output terminal coupled to the first input terminal of the first driver and the second input terminal of the second driver, the fourth input terminal coupled to the second output terminal of the second driver.

27 Claims, 9 Drawing Sheets

OUTPUT SIGNAL CONTROL FROM A DAC-DRIVEN AMPLIFIER-BASED DRIVER

FIELD OF INVENTION

Embodiments of the present invention relate to integrated circuit design, and more particularly, to designing an output port.

BACKGROUND

A typical computer system includes an input/output controller hub ("ICH"). The ICH has a number of ports, via which other components within the computer system are coupled to the ICH. The ports include signal drivers to send signals to the other components. The slew rate of the drivers has to be precise in order to accurately drive the edge of an output signal.

To achieve a precise slew rate in driving the output signal, the current implementation of an output port uses an output driver similar to a digital-to-analog converter ("DAC"), hereinafter referred to as a DAC-like driver, to precisely shift the analog output level of the differential data lines in a stair-step fashion from rail to rail. To generate an output stair step waveform with seven steps, seven identical DAC-like drivers are needed to drive one output signal. The seven identical drivers receive the outgoing data signal passed along seven shift registers. Each shift register is coupled to the input of one of the DAC-like driver. As the data signal from the core of the ICH propagates through the shift registers, each DAC-like driver is successively turned on. The resultant waveform looks like a stair step with transitions in seven equal steps. A DAC-like driver drives the D+ data line and another DAC-like driver drives the D− data line. The D+ and D− data lines are driven opposite to one another.

Driving the data lines in the stair step waveform allows effective control of the output rise time and fall time because each step is identical to one another. Furthermore, the signal cross-over point of the D+ and D− data lines can be easily positioned within one period of the transmit clock by aligning the steps in the middle of the D+ waveform and the D− waveform. The transmit clock cycle and the number of steps may be selected in order to provide the required signal slew rate.

However, the DAC-like driver is a space-consuming design. To worsen the problem, the number of DAC-like drivers required is equal to the number of steps desired in the output stair step waveform. Therefore, multiple DAC-like drivers are needed to generate a single stair step waveform, further complicating the design of the output port.

BRIEF DESCRIPTION OF THE DRAWINGS

Embodiments of the present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Figure 1:
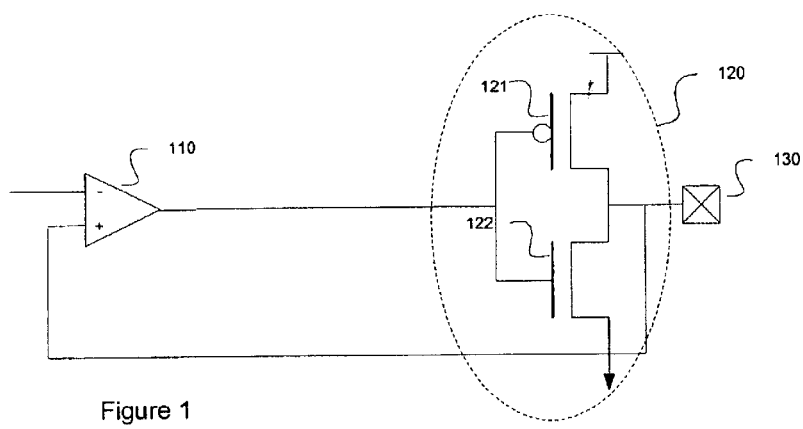
FIG. 1 shows one embodiment of an output port.

FIG. 1 shows one embodiment of an output port. The output port includes an amplifier 110, a driver 120, and an output pad 130. The amplifier 110 is coupled to the driver 120, and the driver 120 is coupled to the output pad 130. A waveform, rising or falling from rail to rail, is supplied to the negative input terminal of the amplifier 110. The output of the amplifier 110 drives the driver 120, which generates an output signal at the output pad 130. The output pad 130 is coupled to the positive terminal of the amplifier 110 to provide a positive feedback signal to the amplifier 110. In response to the positive feedback signal, the amplifier 110 adjusts its output to match the output pad voltage to the analog stair step waveform input.

In one embodiment, the input waveform is a stair step waveform. However, one of ordinary skill in the art would appreciate that the output port operates with other types of input waveforms as well, such as a sinusoidal waveform. The technique described in this disclosure is not limited to input waveform of any particular shapes.

In one embodiment, the amplifier is a differential amplifier with a bandwidth substantially equal to the reciprocal of the step-size of the stair step waveform generated. For example, an amplifier with a bandwidth of at least 100 MHz is used in one embodiment of the port to generate an output stair step waveform with a step length of 10 ns. One should appreciate that other types of amplifiers with different values of bandwidth can be used to implement other embodiments of the output port.

In one embodiment, the driver 120 is a pull-up and pull-down device as shown in FIG. 1. In one embodiment, the pull-up and pull-down device includes a p-type Metal Oxide Semiconductor ("pMOS") transistor 121 to pull up the output voltage at the output pad 130 and an n-type Metal Oxide Semiconductor ("nMOS") transistor 122 to pull down the output voltage at the output pad 130. One should appreciate that other types of drivers are used in other embodiments of the present invention. The pull-up and pull-down device shown in FIG. 1 is for illustrating the technique to control the output signal. Embodiments of the present invention are not limited to using the pull-up and pull-down device.

Figure 2:
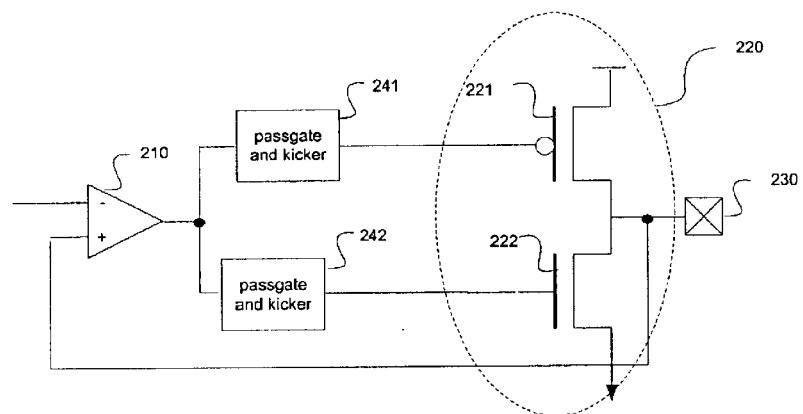
FIG. 2 shows another embodiment of an output port.

FIG. 2 shows an alternate embodiment of an output port. The port includes an amplifier 210, two passgate and kicker circuit blocks 241 and 242, a driver 220, and an output pad 230. The driver 220 includes a pMOS transistor 221 and an nMOS transistor 222. The drains of both transistors 221 and 222 are coupled at the output of the driver. The output of the driver 220 is coupled to the output pad 230. The output of the amplifier 210 is coupled to the gate of the pMOS transistor 221 through the passgate and kicker circuit block 241. Similarly, the output of the amplifier 210 is coupled to the gate of the nMOS transistor 222 through the passgate and kicker circuit block 242. The passgate and kicker circuit blocks 241 and 242 allow the output of the amplifier 210 to be isolated from the driver 220. The embodiment of amplifier and driver circuit in FIG. 2 does not produce a full rail-to-rail output voltage swing. The passgate and kicker circuit block 241 allows the pMOS transistor 221 to be pulled high to fully drive all, while the passgate and kicker circuit block 242 allows the nMOS transistor 222 to be pulled low to fully drive a 0 at the completion of a transition. One should appreciate that other circuitries can be used instead of the passgate and kicker circuit blocks to couple or decouple the driver to the amplifier, such as CMOS switches.

The amplifier 210 receives an input waveform at its negative terminal. In one embodiment, the input waveform is a stair step waveform with seven steps. The output pad 230 is coupled to the positive terminal of the amplifier 210 to provide a positive feedback signal to the amplifier 210. In response to the positive feedback signal, the amplifier 210 adjusts its output to match the output pad voltage to the stair step waveform input.

By way of example, suppose the input signal to the amplifier 210 is a 0. The output signal at the output pad 230 is also at 0 initially. The output pad 230 is coupled to the amplifier 210 to provide a feedback to the amplifier 210. With the input signal at 0 and the feedback signal at 0, the output of the amplifier 210 remains constant because the amplifier 210 is at equilibrium. Suppose the input signal to the amplifier 210 rises from 0 to 1. To remain at equilibrium, the amplifier's 210 output drops to cause the feedback voltage from the output pad 230 to be substantially equal to the input signal to the amplifier 210. Similarly, when the input signal to the amplifier 210 falls from 1 to 0, the amplifier 210 adjusts its output voltage until the feedback voltage from the output pad 230 becomes substantially equal to the input signal to the amplifier 210. In sum, the output voltage at the output pad 230 essentially follows the input signal to the amplifier 210.

Figure 3:
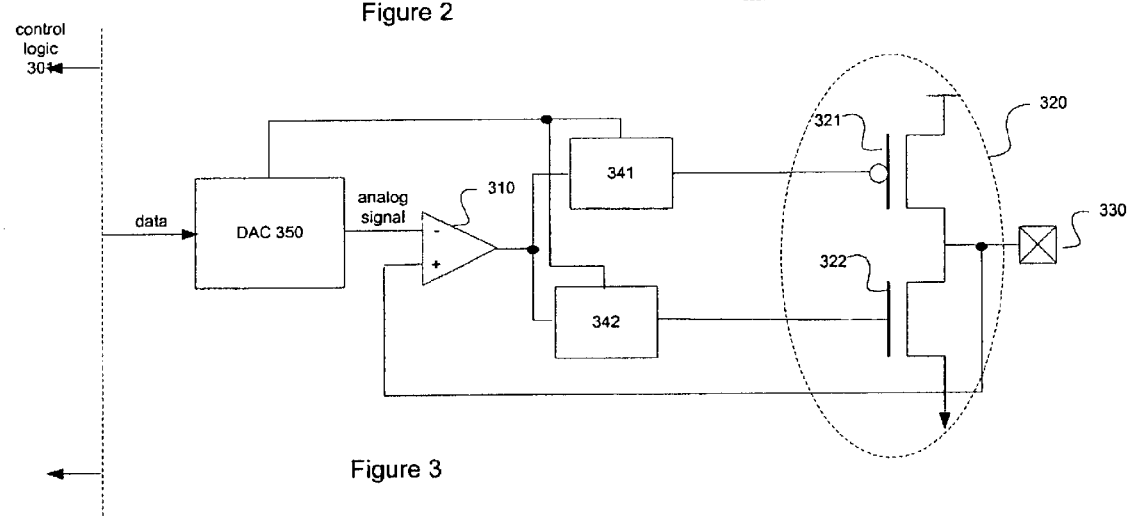
FIG. 3 shows an alternate embodiment of an output port.

FIG. 3 shows an embodiment of an output port having a DAC 350, an amplifier 310, two passgate and kicker circuit blocks 341 and 342, a driver 320, and an output pad 330. The driver 320 includes a pMOS transistor 321 and an nMOS transistor 322. The gates of both the pMOS transistor 321 and the nMOS transistor 322 are coupled at the input of the driver and the drains of both transistors are coupled at the output of the driver, which is coupled to the output pad 330. The amplifier 310 is coupled to the pMOS transistor 321 through the passgate and kicker circuit block 341. In addition, the amplifier 310 is coupled to the nMOS transistor 322 through the passgate and kicker circuit block 342. The passgate and kicker circuit blocks 341 and 342 allow the output of the amplifier 310 to be isolated from the driver 320. In addition, the passgate and kicker. circuit block 341 allows the pMOS transistor 321 to be pulled high to fully drive a 1, while the passgate and kicker circuit block 342 allows the nMOS transistor 322 to be pulled low to fully drive a 0.

The DAC 350 is coupled between the control logic 301 and the amplifier 310. The DAC 350 receives the outgoing data from the control logic 301, and creates an analog stair step waveform, rising or falling in a number of steps from rail to rail. In one embodiment, the waveform has seven steps. The amplifier 310 receives the stair step waveform from the DAC 350 with the amplifier's negative input terminal. The amplifier 310 is also coupled to the output pad 330 at the positive terminal of the amplifier 310 to receive a positive feedback signal from the output pad 330. The amplifier 310 compares the waveform received from the DAC 350 to the positive feedback signal from the output pad 330. In response to the comparison, the amplifier 310 adjusts its output signal driving the driver 320, which controls the output voltage at the output pad 330.

In one embodiment, the DAC 350 is coupled to the passgate and kicker circuit blocks 341 and 342 to send a number of control signals to cause the circuit blocks 341 and 342 to couple or decouple the amplifier 310 and the driver 320. During a transition of the output of the DAC 350, the DAC 350 sends control signals to cause the blocks 341 and 342 to couple the amplifier 310 and the driver 320 so that the output signal of the driver 320 changes in response to the transition. When the output signal of the DAC 350 completes a transition, the DAC 350 sends control signals to cause the blocks 341 and 342 to decouple the amplifier 310 and the driver 320 so that the output signal of the driver can be fully driven to a 1 or a 0 by the blocks 341 and 342. Furthermore, to save power, one embodiment shuts down the amplifier 310 during static level signaling.

One should appreciate that the embodiment of an output driver shown in FIG. 3 is superior to the DAC-like drivers discussed in "Background" section because the embodiment can drive any type of waveform. Moreover, the embodiment shown in FIG. 3 is smaller than a set of DAC-like drivers and potentially consumes less power than the DAC-like drivers.

Figure 4:
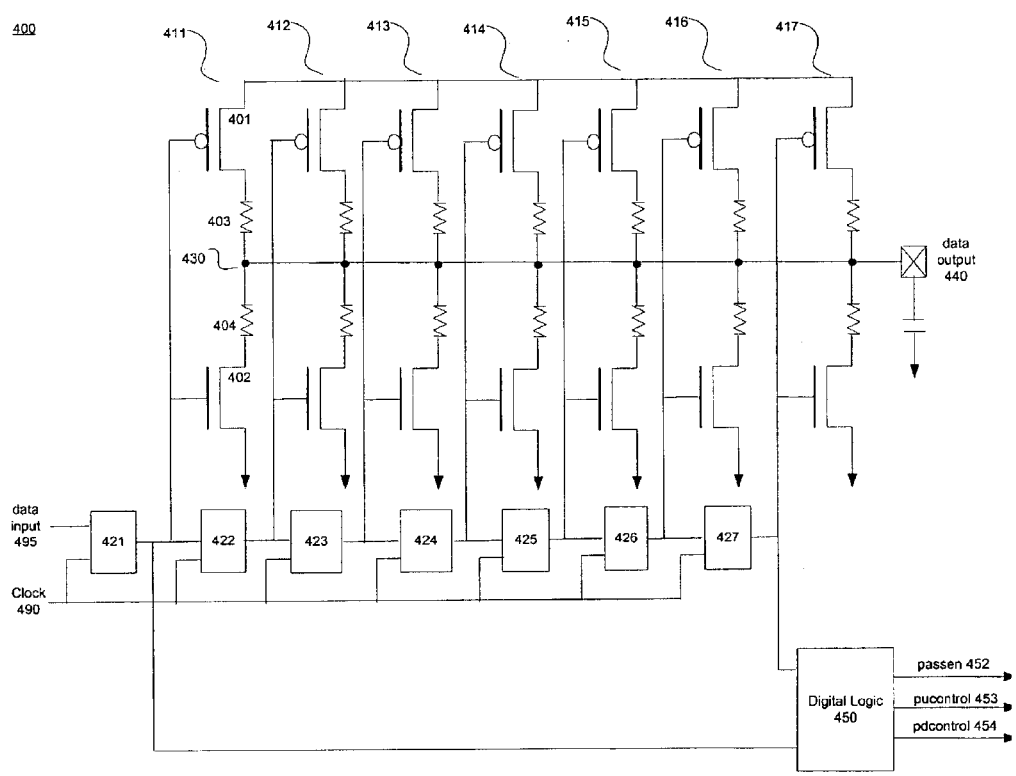
FIG. 4 shows one embodiment of a DAC.

An embodiment of the DAC is shown in FIG. 4. The DAC 400 generates analog stair step waveforms, each waveform having seven steps. The DAC 400 includes seven branches 411–417 to generate the seven steps of a waveform. The branches 411–417 are substantially similar to each other. The following description focuses on the branch 411 only. It should be apparent that the remaining branches 412–417 are structured in a similar way.

Referring to FIG. 4, branch 411 includes a pMOS 401, an nMOS 402, and two resistors 403 and 404. The source of the nMOS 402 is coupled to the ground, and the drain of the nMOS 402 is coupled to one end of the resistor 404. The other end of the resistor 404 is coupled to the node 430. One end of the resistor 403 is coupled to node 430, and the other end of the resistor 403 is coupled to the drain of the pMOS 401. The source of the pMOS 401 is coupled to the positive rail voltage. In another embodiment, more than two resistors are coupled between the drain of the pMOS 401 and the drain of the nMOS 402. In another embodiment, there is no resistor coupled between the drain of the pMOS 401 and the drain of the nMOS 402. All branches 411–417 are coupled to each other at node 430 to drive the output signal at the output pad 440.

In addition to the branches 411–417, the DAC 400 includes seven registers 421–427 to store the incoming data to drive the transistors in the branches 411–417. In one embodiment, the registers 421–427 are implemented with flip-flops. All the registers 421–427 receive a clock signal 490. The registers 421–427 are coupled to each other in a way such that the output of the register 421 is input to the register 422, the output of the register 422 is input to the register 423, and so on. The register 421 receives incoming data 495, which propagates through the registers 421–427 one register per clock cycle. The output of each of the registers 421–427 is also coupled to the corresponding branch. For example, the output of the register 421 is coupled to the gates of the transistors 401 and 402 of the branch 411.

The DAC 400 further includes a digital logic circuitry 450 to generate at least three control signals, namely, passen 452, pucontrol 453, and pdcontrol 454. The digital logic circuitry 450 receives the data output from the register 421 and the data output of the register 427 to determine when a transition in the input data 495 occurs. The transition can be either from 0 to 1 or from 1 to 0. If there is a transition in the input data 495, the passen signal 452 will go high to enable the passgate (not shown) to pass the output signal of the amplifier to the driver. Otherwise, the passen signal 452 will go low to disable the passgate and either the pucontrol 453 will go low to cause the kicker to pull up the output voltage of the driver (not shown) or the pdcontrol 454 will go high to cause the kicker to pull down the output voltage of the driver.

Suppose the incoming data is 0, corresponding to a low voltage. Through register 421, the low voltage is applied to the gates of the transistors 401 and 402 of branch 411 to activate the pMOS transistor 401 and to deactivate the nMOS transistor 402. The activated pMOS transistor 401 pulls up the voltage at node 430. As the incoming data propagates through the registers 422–427, the incoming data activates the pMOS transistors and deactivates the nMOS transistors in the remaining branches 412–417 successively. As each pMOS transistor is activated, more current flows into node 430, causing the output signal at the output pad 440 to rise. Therefore, the resultant output waveform looks like a staircase, rising in 7 steps. Both the incoming data and the output signal of the DAC 400 are shown in FIG. 4A.

Figure 4A:
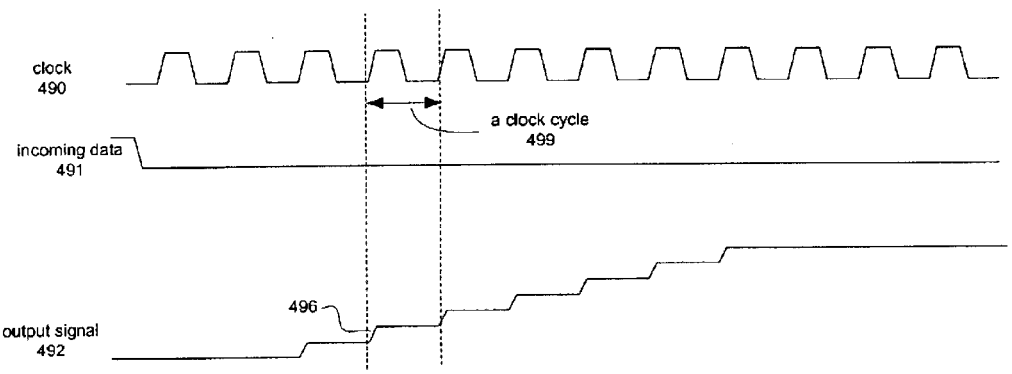
FIG. 4A shows an input signal to an embodiment of a DAC dropping from high to low and the resultant output signal of the DAC.
Figure 4B:
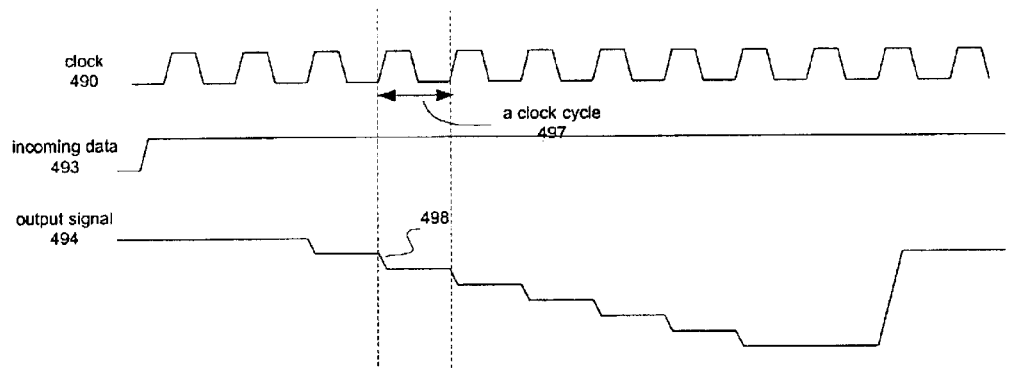
FIG. 4B shows an input signal to an embodiment of a DAC rising from low to high and the resultant output signal of the DAC.

Referring to FIG. 4A, the incoming data 491 drops from high to low, representing a change from 1 to 0. As the incoming data 491 propagates through one register in the DAC 400 through each clock cycle, the output signal 492 rises by one step in each clock cycle. For example, the output signal 492 rises by the step 496 in the clock cycle 499. Similarly, when the incoming data changes from 0 to 1, the data propagates through the registers 421–427 to activate the nMOS transistors and to deactivate the pMOS transistors in the branches 411–417 one-by-one, causing the output signal at node 430 to fall in successive steps. FIG. 4B shows the output signal waveform caused by an incoming data changing from 0 to 1. In FIG. 4B, the incoming data 493 rises from low to high, representing a change from 0 to 1. The incoming data 493 propagates to one register in the DAC 400 through each clock cycle. Therefore, the output signal 494 falls by one step in each clock cycle. For example, the output signal 494 falls by the step 498 in the clock cycle 497.

Figure 5:
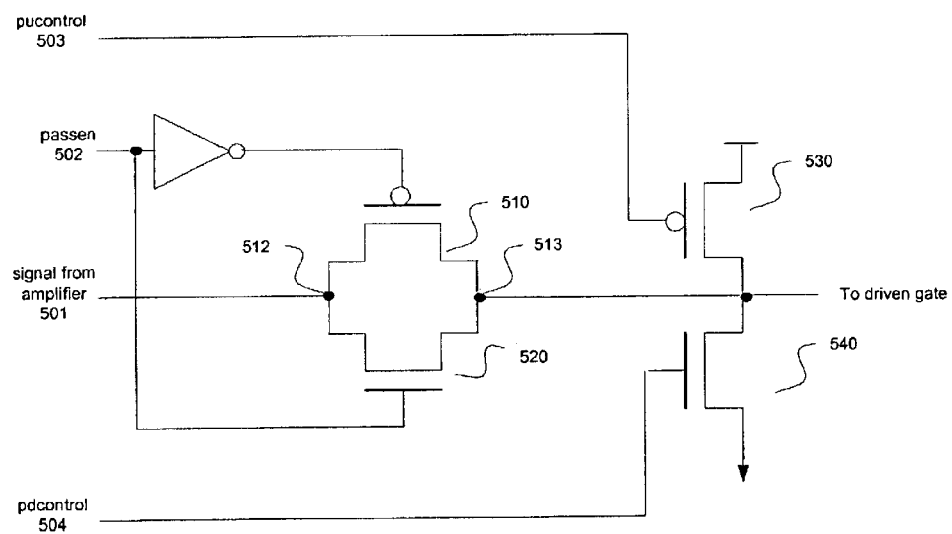
FIG. 5 shows an embodiment of a passgate and kicker circuit block.

FIG. 5 shows an embodiment of a passgate and kicker circuit block. The circuit block 500 includes a pMOS 510 and an nMOS 520. The drains of the pMOS 510 and the nMOS 520 are coupled to each other at node 512 and the transistors' sources are coupled to each other at node 513. The signal passen 502 controls the transistors 510 and 520. When the signal passen 502 is at a high voltage, the transistors 510 and 520 are activated. On the contrary, when the signal passen 502 is at a low voltage, the transistors 510 and 520 are deactivated. The circuit block 500 receives an input signal 501 from an amplifier at node 512. When the transistors 510 and 520 are activated, the input signal 501 is passed through the transistors 510 and 520 to node 513. When the transistors 510 and 520 are deactivated, the input signal 501 is not passed to node 513.

The circuit block 500 further includes a second pMOS 530 and a second nMOS 540. The source of the pMOS 530 is coupled to a positive rail voltage and the drain of the pMOS 530 is coupled to the drain of the nMOS 540 at the node 513. The source of the nMOS 540 is grounded. A signal, pucontrol 503 drives the pMOS 530 to pull up the output voltage at node 513. Similarly, a signal, pdcontrol 504 drives the nMOS 540 to pull down the output voltage at node 513. When the pMOS 510 and the nMOS 520 are deactivated to block the input signal 501 from node 513, either pucontrol 503 would pull up the voltage at the node 513, or pdcontrol 504 would pull down the voltage at node 513. In one embodiment, pucontrol 503 and pdcontrol 504 are from logic within the DAC block, which also generates the input signal to the amplifier, as shown in FIG. 4. The operation of an embodiment of the DAC block has been described above.

To illustrate the operation of the circuit in FIG. 5, suppose a low-to-high transition in the signal 501 from the amplifier has completed. At this point the gate of the pMOS 530 is pulled up to VCC (deactivated) and the gate of the nMOS 540 us pulled down to 1V (deactivated). The transistors 510 and 520 are deactivated to isolate the amplifier signal from node 513. The gate of the pMOS 530 is pulled down to a safe low level. In one embodiment, the safe low level is at 0V. In an alternate embodiment using another process technology, the safe low level is above 0V. The gate of the nMOS 540 is held low at to 0V. In one embodiment, the amplifier (not shown in FIG. 5) is disabled for the duration of the bit time to save static power, while the passgate and kicker circuit block 500 holds the driver gates in this state. Similarly, during a high-to-low transition, the gate of the pMOS 530 is pulled up to VCC (deactivated) and the gate of the nMOS 540 us pulled down to 0V (deactivated). Following this high-to-low transition, the transistors 510 and 520 are deactivated to isolate the amplifier signal from node 513. The gate of the pMOS 530 is held high at VCC, and the gate of the nMOS 540 is pulled up to a safe high voltage. In one embodiment, the safe high level is at VCC, which is at 3.3V. In an alternate embodiment using another technology, the safe high level is below VCC, for example, 2.5V. When it is time to drive another edge transition, the transistors 510 and 520 will be activated to pass the signal from the amplifier to the output at node 513.

Figure 6:
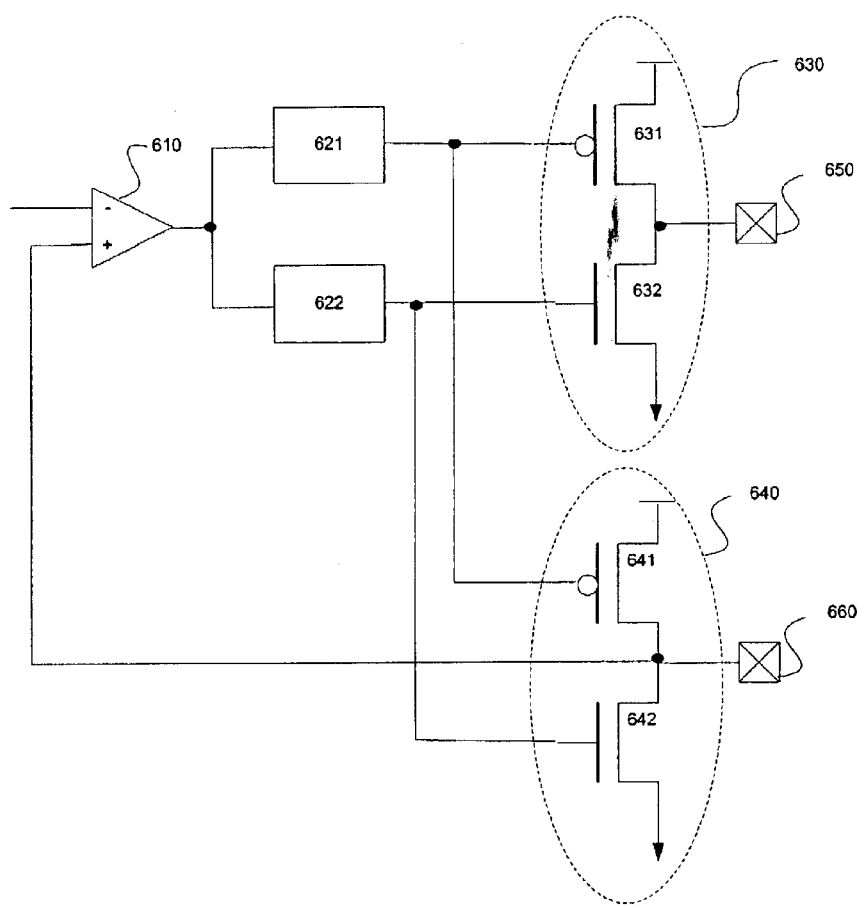
FIG. 6 shows an embodiment of an output port including a pseudo-driver.

To ensure that feedback is not affected by reflection onto the output pad, one embodiment includes a pseudo-driver to generate the feedback signal. FIG. 6 shows an embodiment of a port including a pseudo-driver. The port in FIG. 6 includes an amplifier 610, two passgate and kicker circuit blocks 621 and 622, a driver 630, an output pad 650, a pseudo-driver 640, and a pseudo-pad 660. The driver 630 includes a pMOS 631 and an nMOS 632. The source of the pMOS 631 is coupled to the positive rail voltage and the drain of the pMOS 631 is coupled to the drain of the nMOS 632. The source of the nMOS 632 is grounded. The drains of both pMOS 631 and nMOS 632 are coupled to the output pad 650.

Referring to FIG. 6, the pseudo-driver 640 includes a pMOS 641 and an nMOS 642, which are coupled to each other in a manner similar to the pMOS 631 and the nMOS 632 of the driver 630. The drains of both pMOS 641 and nMOS 642 are coupled to at the pseudo-pad 660 to drive a pseudo output signal at the pseudo-pad 660. The pseudo-pad 660 is not a real output pad and it is not coupled to any external component. Therefore, the signal at the pseudo-pad 660 is not interfered by external pad reflections. The pseudo-pad 660 is coupled to one of the input terminal of the amplifier 610. In one embodiment, the pseudo-pad 660 is coupled to the positive input terminal of the amplifier 610 to provide a positive feedback signal to the amplifier 610. In another embodiment, the pseudo-pad is coupled to the negative input terminal of the amplifier to provide a negative feedback signal to the amplifier. The feedback signal is created using the pseudo-driver 640 to ensure that external pad reflections do not interfere with the feedback signal created.

The pseudo-driver 640 is configured to be electrically similar to the real driver 630 in order to generate an accurate feedback signal. Therefore, the pseudo output signal at the pseudo-pad 660 is proportional to the real output signal at the output pad 650. In one embodiment, the pseudo-driver 640 is in the same size as the actual driver 630. However, it is not necessary to make the pseudo-driver 640 in the same size as the actual driver 630. In one embodiment, the pseudo-driver is 1/10 the size of the actual driver, and therefore, the pseudo-driver has 10 times the impedance of the actual driver.

The output of the amplifier 610 is coupled to the input of both passgate and kicker circuit blocks 621 and 622. The output of the block 621 is coupled to the gate of the pMOS 631 and the gate of the pMOS 641. The output of the block 622 is coupled to the gate of the nMOS 632 and the gate of the nMOS 642. The output voltage of the amplifier 610 is passed onto the driver 630 to generate an output voltage at the output pad 650, and the pseudo-driver 640 to generate a feedback signal at the pseudo-pad 660.

Figure 7:
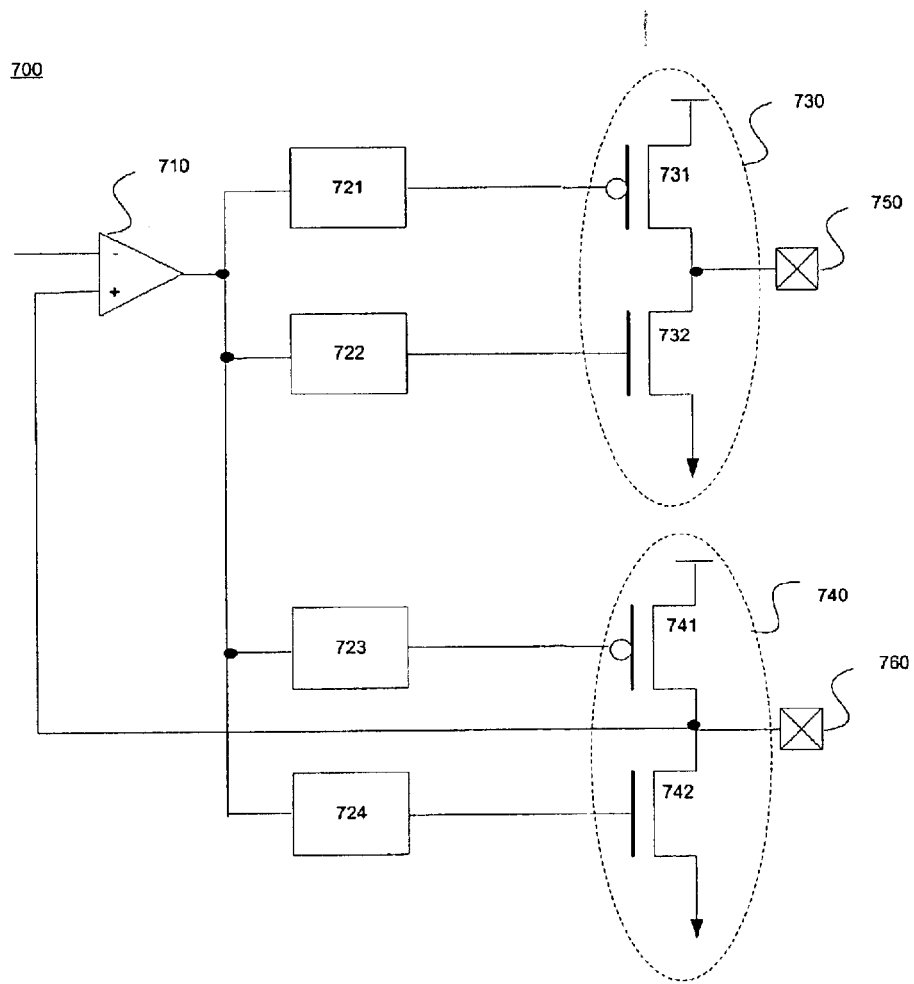
FIG. 7 shows another embodiment of an output port.

FIG. 7 shows another embodiment of an output port. Similar to the embodiment in FIG. 6, the output port 700 includes an amplifier 710, a driver 730, a pseudo-driver 740, an output pad 750, and a pseudo-pad 760. The output port 700 further includes four passgate and kicker circuit blocks 721–724. The driver 730 includes a pMOS 731 and an nMOS 732. The source of the pMOS 731 is coupled to the positive rail voltage and the drain of the pMOS 731 is coupled to the drain of the nMOS 732. The source of the nMOS 732 is grounded. The drains of both pMOS 731 and nMOS 732 drive an output signal at the output pad 750. The pseudo-driver 740 also includes a pMOS 741 and an nMOS 742 arranged in a way similar to the transistors 731 and 732 of the driver 730.

The output port 700 further includes 4 passgate and kicker circuit blocks 721–724. Block 721 is coupled between the output of the amplifier 710 and the gate of the transistor 731. Block 722 is coupled between the output of the amplifier 710 and the gate of the transistor 732. Block 723 is coupled between the output of the amplifier 710 and the gate of the transistor 741. Block 724 is coupled between the output of the amplifier 710 and the gate of the transistor 742. The blocks 721–724 can be activated or deactivated to pass the output signal of the amplifier 710 to the driver 730 and/or the pseudo-driver 740.

Figure 8:
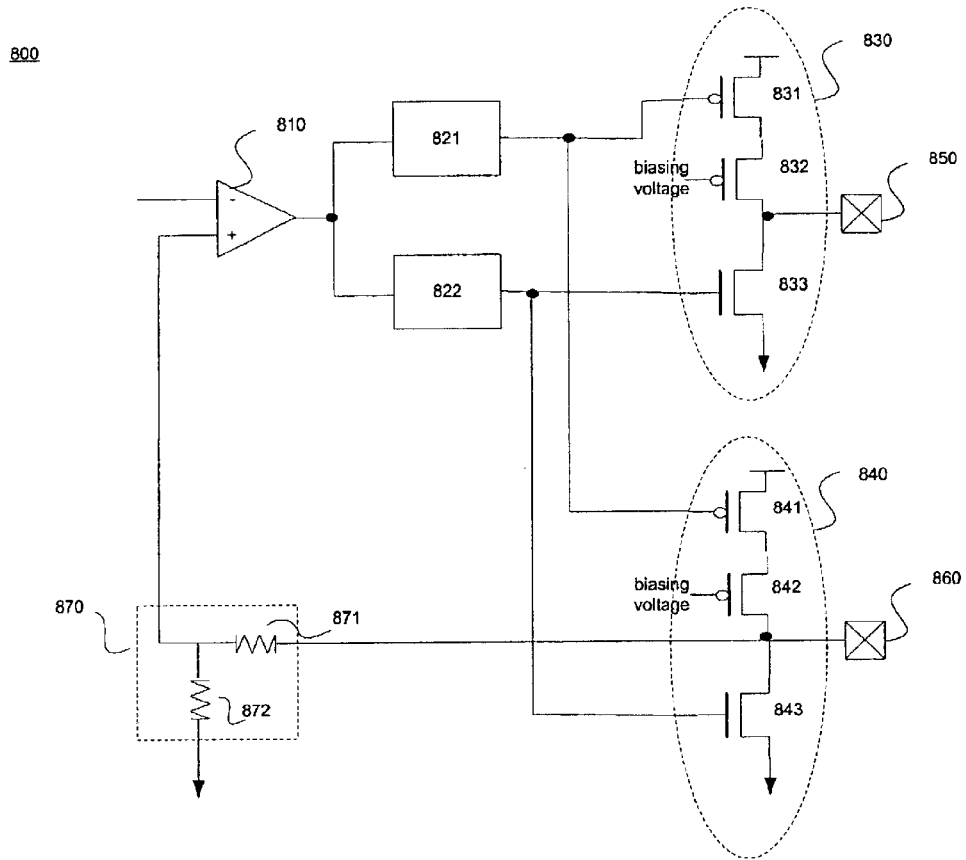
FIG. 8 shows an alternate embodiment of an output port.

FIG. 8 shows an alternate embodiment of an output port. Similar to the embodiment in FIG. 6, the output port 800 includes an amplifier 810, two passgate and kicker circuit blocks 821 and 822, a driver 830, a pseudo-driver 840, an output pad 850, and a pseudo-pad 860. Unlike the port in FIG. 6, the driver 830 includes a first pMOS 831, an nMOS 833, and a second pMOS 832. The source of the first pMOS 831 is coupled to the positive rail voltage and the drain of the first pMOS 831 is coupled to the source of the second pMOS 832 to form a stacked structure. The drain of the second pMOS 832 is coupled to the drain of the nMOS 833. The source of the nMOS 833 is grounded. The output signal at the output pad 850 is taken from the node between the second pMOS 832 and the nMOS 833. The pseudo-driver 840 also includes two pMOS 841–842 and an nMOS 843 arranged in a similar way as the driver 830. The gates of both pMOS 832 and 842 are biased. In one embodiment, the gates of pMOS 832 and 842 are biased at 0.8V. When a high voltage is detected, the biasing voltage at the gates of pMOS 832 and 842 rises to 5V in one embodiment to maintain a safe voltage across pMOS gates 832 and 842.

The amplifier 810 receives an input signal at its negative input terminal and a feedback signal at its positive input terminal. The output of the amplifier 810 is coupled to the passgate and kicker circuit blocks 821 and 822. The output of the block 821 is coupled to the pMOS 831 and the pMOS 841. Similarly, the output of the block 822 is coupled to the nMOS 833 and the nMOS 843. The pseudo-pad 860 is coupled to the positive input terminal of the amplifier 810 via a voltage divider 870. The voltage divider 870 reduces the range of the feedback signal to accommodate the amplifier 810 which may use devices with a lower voltage limit to achieve a high bandwidth. In one embodiment, the voltage divider 870 reduces the feedback signal range from 3.3V to 1.5V. An embodiment of the voltage divider 870 includes two resistors 871 and 872 in the range of 5 kΩ to 10 kΩ.

Figure 9:
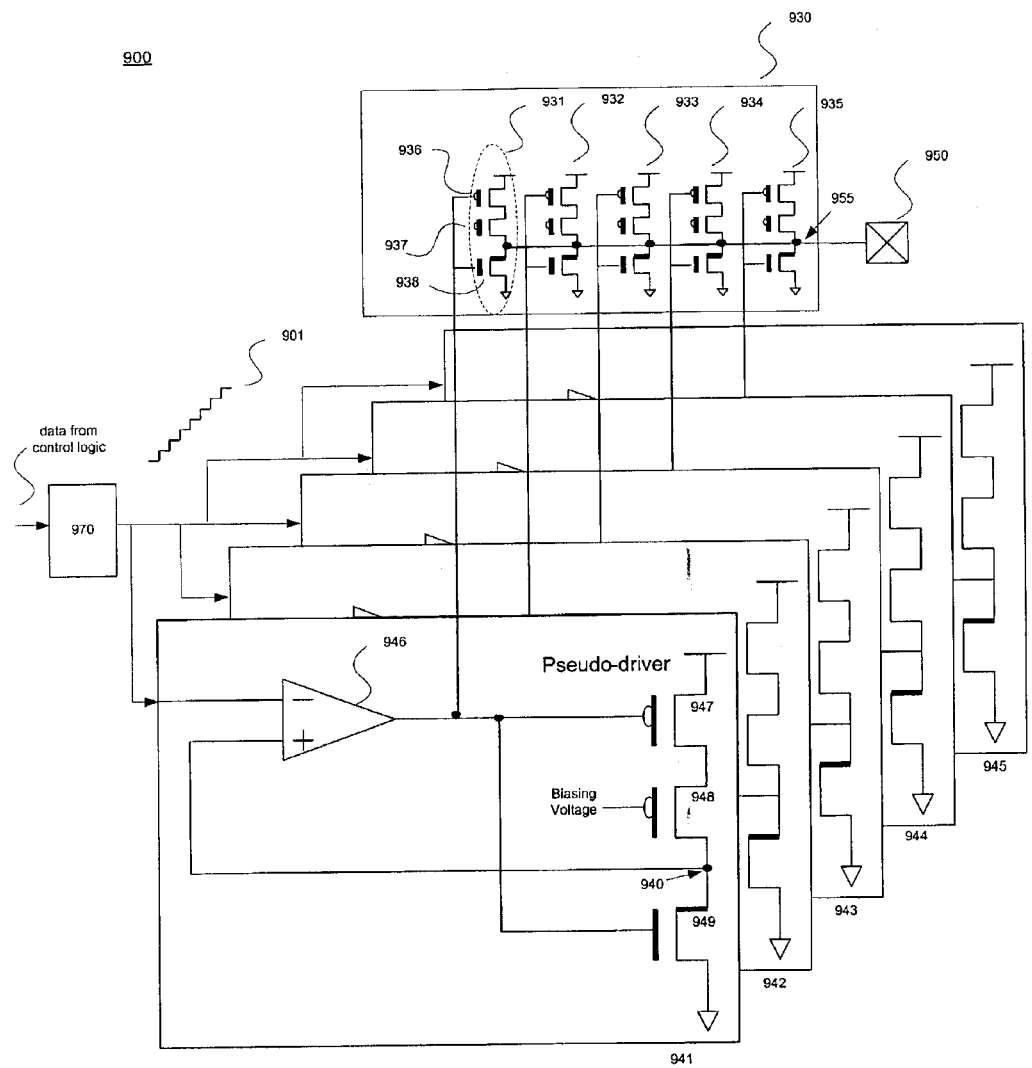
FIG. 9 shows an embodiment of output port with resistive compensation.

In order to implement resistive compensation in one embodiment of the output driver, an embodiment of the output port includes a driver with multiple legs. Such an embodiment is shown in FIG. 9. The output port 900 in FIG. 9 includes a driver 930 with five legs 931–935. Each leg has substantially the same structure. For the purpose of illustration, the following description focuses on the leg 931. The leg 931 includes a pMOS 936, a second pMOS 937, and an nMOS 938. The source of the pMOS 936 is coupled to the positive rail voltage, and the drain of the pMOS 936 is coupled to the source of the second pMOS 937 to form a stacked structure. The gate of the second pMOS 937 is biased. The drain of the second pMOS 937 is coupled to the drain of the nMOS 938 at node 955. The other legs 932–935 are coupled to node 955 in a way similar to the leg 931. The legs 931–935 are coupled to each other at node 955 to drive the output voltage at the output pad 950.

Depending on the compensation scheme adopted, the gate size of the transistors in the legs 931–935 of the driver 930 may be varied greatly. For example, suppose the embodiment shown in FIG. 9 adopts a binary weighted compensation scheme, then the gate size of the transistors in the leg 932 would be twice the gate size of the transistors in the leg 931, the gate size of the transistors in the leg 933 would be 4 times the gate size of the transistors in the leg 931, the gate size of the transistors in the leg 934 would be 8 times the gate size of the transistors in the leg 931, and the gate size of the transistors in the leg 933 would be 16 times the gate size of the transistors in the leg 931. In order to provide precise feedback on each leg in the driver 930, a separate amplifier and a separate pseudo-driver are provided to each leg of the output driver 930. Referring to FIG. 9, a module including an amplifier and a pseudo-driver is coupled to each leg of the driver 930. The output port 900 has 5 such modules 941–945 because the driver 930 has 5 legs. All five modules 941–945 have substantially the same structure. However, the gate size of the transistors of the pseudo-driver in each of the modules 941–945 varies in a way proportional to the gate size of the transistors of the legs 931–935 of the driver 930.

For the purpose of illustration, the following description focuses on the module 941. One should appreciate that the remaining modules 942–945 are structured in a similar way as the module 941. The module 941 includes an amplifier 946 and a pseudo-driver having two pMOS 947 and 948 and an nMOS 949. The transistors 947–949 of the pseudo-driver are arranged in a similar way as the transistors 936–938 in the leg 931 of the driver 930. In one embodiment, a biasing voltage of 0.8V is applied at the gate of the pMOS 948. The transistors 947–949 generate a feedback signal at node 940, which is coupled to the positive input terminal of the amplifier 946. The negative input terminal of the amplifier 946 receives an input waveform 901 and compares the input waveform 901 with the feedback signal from node 940. Based on the comparison, the amplifier 946 adjusts the output of the amplifier 946, which is coupled to the gates of transistor 936 and 938 to drive the leg 931 of the driver 930 to generate the output signal at node 955. The output of the amplifier 946 is also coupled to the gates of the transistors 947 and 949 to generate the feedback signal at node 940

In one embodiment, the input waveform 901 is an analog stair step waveform. However, other types of input waveform can be used in other embodiments. In another embodiment, the output port further includes a DAC 970. The DAC 970 receives data from the control logic (not shown) and generates the input waveform 901 in response to the data received. The output of the DAC 970 is coupled to the negative input terminals of amplifiers in all modules 941–945 to provide the input waveform 901 to the amplifiers.

One should appreciate that the structure and the operation of the other legs of the driver 930 and the other modules 941–945 are similar to the leg 931 and the module 941. Different numbers of legs in the driver 930 and the associated modules are used in different embodiments, such as 2, 3, etc. Alternative embodiments may include or exclude passgate and kicker blocks, dummy drivers, a voltage divider, and/or additional transistors to implement output port 900, as illustrated in FIGS. 1, 2, 3, 6, 7, and 8. These different implementations are not shown in FIG. 9 for simplicity, although one skilled in the art will readily recognize these alternatives.

Figure 10:
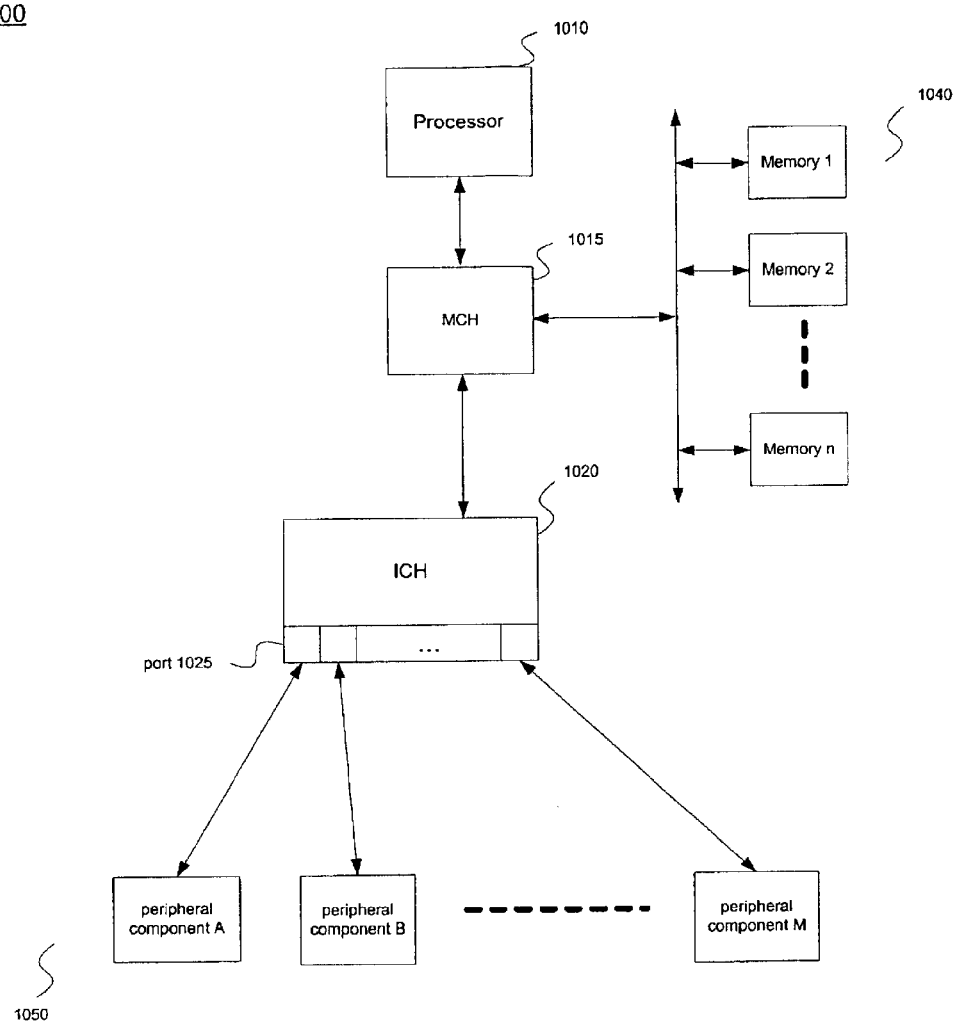
FIG. 10 shows an exemplary embodiment of a computer system.

FIG. 10 shows an exemplary embodiment of a computer system. Computer system 1000 in FIG. 10 includes processor 1010, memory controller hub ("MCH") 1015, memory devices 1040, input/output controller hub ("ICH") 1020, and peripheral components 1050. Processor 1010, memory devices 1040, and ICH 1020 are coupled to MCH 1015. ICH 1020 includes a number of ports. The ports may be of one or more different types. For example, the ports may include a Universal Serial Bus ("USB") port, a second generation USB ("USB2") port, an Integrated Device Electronics ("IDE") port, a Peripheral Component Interconnect ("PCI") port, etc. Each peripheral component is coupled to ICH 1020 via one of the ports. Port 1025 of ICH 1020 includes an amplifier, a driver, and an output pad. The amplifier is coupled to the drive, and the driver is coupled to the output pad. An input waveform, rising or falling from rail to rail, is supplied to the negative input terminal of the amplifier from the core logic of ICH 1020. The output of the amplifier drives the driver, which generates an output signal at the output pad. The output pad is coupled to the positive terminal of the amplifier to provide a positive feedback signal to the amplifier. In response to the positive feedback signal, the amplifier adjusts its output to match the output pad voltage to the analog stair step waveform input.

In another embodiment, port 1025 of ICH 1020 includes an amplifier, two passgate and kicker circuit blocks, a driver, an output pad, a pseudo-driver, and a pseudo-pad. The driver includes a pMOS and an nMOS. The source of the pMOS is coupled to the positive rail voltage and the drain of the pMOS is coupled to the drain of the nMOS. The source of the nMOS is grounded. The drains of both pMOS and nMOS are coupled to the output pad. The structure of the pseudo-driver is substantially similar to the driver. In one embodiment, the pseudo-driver is a scaled-down replica of the driver. The pseudo-driver drives a pseudo-output signal at the pseudo-pad and the pseudo output signal is proportional to the real output signal at the output pad. The pseudo-pad is not a real output pad and it is not coupled to any external component. Therefore, the signal at the pseudo-pad is not interfered by the external pad reflections. The pseudo-pad is coupled to one of the input terminal of the amplifier. In one embodiment, the pseudo-pad is coupled to the positive input terminal of the amplifier to provide a positive feedback signal to the amplifier. In another embodiment, the pseudo-pad is coupled to the negative input terminal of the amplifier to provide a negative feedback signal to the amplifier. Using the pseudo-driver to create a feedback signal ensures that the external pad reflections do not interfere with the feedback signal.

The foregoing discussion merely describes some exemplary embodiments of the present invention. One skilled in the art will readily recognize from such discussion, the accompanying drawings and the claims that various modifications can be made without departing from the spirit and scope of the appended claims. The description is thus to be regarded as illustrative instead of limiting.

What is claimed is:

1. An apparatus comprising:
    a first driver to drive an output signal onto an output pad, the first driver having a first input terminal and a first output terminal;
    a second driver to generate a feedback, the second driver having a second input terminal and a second output terminal, the second output terminal is electrically isolated from the output pad;
    a digital-to-analog converter ("DAC") having an input terminal and an output terminal; and
    an amplifier having a third input terminal coupled to the output terminal of the DAC to receive an input signal, a fourth input terminal, and a third output terminal, the third output terminal being coupled to the first input terminal of the first driver and the second input terminal of the second driver, and the fourth input terminal being coupled to the second output terminal of the second driver.

2. The apparatus of claim 1, wherein the size of the first driver is substantially proportional to the size of the second driver by an integer.

3. The apparatus of claim 1, further comprising:
    a first one or more circuitries coupled between the amplifier and the first driver, the first one or more circuitries operable to electrically couple or decouple the amplifier and the first driver in response to one or more control signals; and
    a second one or more circuitries coupled between the amplifier and the second driver, the second one or more circuitries operable to electrically couple or decouple the amplifier and the second driver in response to the one or more control signals.

4. The apparatus of claim 3, wherein the DAC generates the one or more control signals.

5. The apparatus of claim 1, wherein the third input terminal of the amplifier is a negative input terminal and the fourth input terminal of the amplifier is a positive input terminal.

6. The apparatus of claim 1, wherein the first driver comprises a first pull-up transistor and a first pull-down transistor, the first pull-up transistor and the first pull-down transistor being coupled to each other at the first input terminal and the first output terminal.

7. The apparatus of claim 6, wherein the second driver comprises a second pull-up transistor and a second pull-down transistor, the second pull-up transistor and the second pull-down transistor being coupled to each other at the second input terminal and the second output terminal.

8. An apparatus comprising:
an output pad;
a digital-to-analog converter ("DAC") having an input terminal and an output terminal; and
a plurality of circuitries coupled to the output pad to drive an output signal on the output pad, wherein each of the plurality of circuitries comprises
a first driver having a first input terminal and a first output terminal, the first output terminal being coupled to the output pad to drive the output signal;
a second driver to generate a feedback, the second driver having a second input terminal and a second output terminal, wherein the second output terminal is electrically isolated from the output pad; and
an amplifier having a third input terminal coupled to the output terminal of the DAC to receive an input signal, a fourth input terminal, and a third output terminal, the third output terminal being coupled to the first input terminal of the first driver and the second input terminal of the second driver, and the fourth input terminal being coupled to the second output terminal of the second driver.

9. The apparatus of claim 8, wherein the third input terminal of the amplifier is a negative terminal and the fourth input terminal of the amplifier is a positive terminal.

10. The apparatus of claim 8, wherein the first driver comprises a first pull-up transistor and a first pull-down transistor, the first pull-up transistor and the first pull-down transistor being coupled to each other at the first input terminal and the first output terminal.

11. The apparatus of claim 10, wherein the second driver comprises a second pull-up transistor and a second pull-down transistor, the second pull-up transistor and the second pull-down transistor being coupled to each other at the second input terminal and the second output terminal.

12. A method comprising:
receiving an input signal generated from a digital-to-analog converter ("DAC");
generating a voltage to drive a first driver to generate an output signal on an output pad and to drive a second driver to generate a feedback signal, wherein the feedback signal is electrically isolated from the output pad; and
adjusting the voltage in response to the feedback signal to cause the output signal to match the input signal.

13. The method of claim 12, further comprising isolating the voltage from the first driver and from the second driver when the input signal has completed a transition from a first logic level to a second logic level.

14. The method of claim 12, wherein the feedback signal is a positive feedback signal.

15. A system comprising:
a graphics chip;
an input/output controller hub including a port, the graphics chip being coupled to the input/output controller hub via the port, wherein the port comprises a first driver to drive an output signal onto an output pad, the first driver having a first input terminal and a first output terminal;
a second driver to generate a feedback, the second driver having a second input terminal and a second output terminal, wherein the second output terminal is electrically isolated from the output pad;
a digital-to-analog converter ("DAC") having an input terminal and an output terminal; and
an amplifier having a third input terminal coupled to the output terminal of the DAC to receive an input signal, a fourth input terminal, and a third output terminal, the third output terminal being coupled to the first input terminal of the first driver and the second input terminal of the second driver, the fourth input terminal being coupled to the second output terminal of the second driver.

16. The system of claim 15, wherein the size of the first driver is substantially proportional to the size of the second driver by an integer.

17. The system of claim 15, wherein the port further comprises:
a first one or more circuitries coupled between the amplifier and the first driver, the first one or more circuitries operable to electrically couple or decouple the amplifier and the first driver in response to one or more control signals; and
a second one or more circuitries coupled between the amplifier and the second driver, the second plurality of circuitries operable to electrically couple or decouple the amplifier and the second driver in response to the one or more control signals.

18. The system of claim 17, wherein the DAC generates the one or more control signals.

19. The system of claim 15, wherein the third input terminal of the amplifier is a negative input terminal and the fourth input terminal of the amplifier is a positive input terminal.

20. The system of claim 15, wherein the first driver comprises a first pull-up transistor and a first pull-down transistor, the first pull-up transistor and the first pull-down transistor being coupled to each other at the first input terminal and the first output terminal.

21. The system of claim 20, wherein the second driver comprises a second pull-up transistor and a second pull-down transistor, the second pull-up transistor and the second pull-down transistor being coupled to each other at the second input terminal and the second output terminal.

22. A system comprising:
a graphics chip; and
an input/output controller hub including a port, the graphics chip being coupled to the input/output controller hub via the port, wherein the port comprises
an output pad;
a digital-to-analog converter ("DAC") having an input terminal and an output terminal; and
a plurality of circuitries being coupled to the output pad to drive an output signal on the output pad, wherein each of the plurality of circuitries comprises
a first driver having a first input terminal and a first output terminal, the first output terminal coupled to the output pad to drive the output signal on the output pad,
a second driver to generate a feedback, the second driver having a second input terminal and a second output terminal, wherein the second output terminal is electrically isolated from the output pad, and an amplifier having a third input terminal coupled to the output terminal of the DAC to receive an input signal, a fourth input terminal, and a third output terminal, the third output terminal being coupled to the first input terminal of the first driver and the second input terminal of the second driver, and the fourth input terminal being coupled to the second output terminal of the second driver.

23. The system of claim 22, wherein the DAC generates a reference waveform to drive the amplifier and the amplifier drives the first and the second drivers to generate the output signal and the feedback respectively.

24. The system of claim 23, wherein the edgerate of the output signal and the edgerate of the reference waveform are substantially the same.

25. The system of claim 22, wherein the third input terminal of the amplifier is a negative terminal and the fourth input terminal of the amplifier is a positive terminal.

26. The system of claim 22, wherein the first driver comprises a first pull-up transistor and a first pull-down transistor, the first pull-up transistor and the first pull-down transistor being coupled to each other at the first input terminal and the first output terminal.

27. The system of claim 26, wherein the second driver comprises a second pull-up transistor and a second pull-down transistor, the second pull-up transistor and the second pull-down transistor being coupled to each other at the second input terminal and the second output terminal.

* * * * *

UNITED STATES PATENT AND TRADEMARK OFFICE
CERTIFICATE OF CORRECTION

PATENT NO. : 6,864,726 B2
DATED : March 8, 2005
INVENTOR(S) : Levin et al.

It is certified that error appears in the above-identified patent and that said Letters Patent is hereby corrected as shown below:

Column 3,
Line 15, delete "all" and insert -- a 1 --.

Column 6,
Line 25, delete "1V" and insert -- 0V --.

Signed and Sealed this

Sixteenth Day of August, 2005

JON W. DUDAS
*Director of the United States Patent and Trademark Office*